United States Patent
Ewe et al.

(10) Patent No.: US 8,097,936 B2
(45) Date of Patent: Jan. 17, 2012

(54) COMPONENT, POWER COMPONENT, APPARATUS, METHOD OF MANUFACTURING A COMPONENT, AND METHOD OF MANUFACTURING A POWER SEMICONDUCTOR COMPONENT

(75) Inventors: Henrik Ewe, Burglengenfeld (DE); Joachim Mahler, Regensburg (DE)

(73) Assignee: Infineon Technologies AG, Munich (DE)

( * ) Notice: Subject to any disclaimer, the term of this patent is extended or adjusted under 35 U.S.C. 154(b) by 141 days.

(21) Appl. No.: 11/685,321

(22) Filed: Mar. 13, 2007

(65) Prior Publication Data

US 2008/0203550 A1 Aug. 28, 2008

(30) Foreign Application Priority Data

Feb. 27, 2007 (DE) .......................... 10 2007 009 521

(51) Int. Cl.
H01L 23/495 (2006.01)
(52) U.S. Cl. ................ 257/675; 257/686; 257/E21.418; 438/612
(58) Field of Classification Search .................. 257/728, 257/177, 676, 686, 666, 675; 438/612
See application file for complete search history.

(56) References Cited

U.S. PATENT DOCUMENTS

| | | | |
|---|---|---|---|
| 5,532,512 A * | 7/1996 | Fillion et al. | 257/686 |
| 5,594,234 A | 1/1997 | Carter, Jr. et al. | 257/676 |
| 5,637,922 A * | 6/1997 | Fillion et al. | 257/728 |
| 5,719,433 A | 2/1998 | Delage et al. | 257/625 |
| 5,869,894 A | 2/1999 | Degani et al. | 257/723 |
| 6,201,696 B1 * | 3/2001 | Shimizu et al. | 361/704 |
| 6,777,800 B2 | 8/2004 | Madrid et al. | 257/690 |
| 7,064,038 B2 | 6/2006 | Kudo et al. | 438/296 |
| 7,208,347 B2 | 4/2007 | Seliger et al. | 438/124 |
| 7,443,014 B2 * | 10/2008 | Otremba | 257/676 |
| 2001/0052641 A1 * | 12/2001 | Kuo et al. | 257/686 |
| 2004/0080028 A1 * | 4/2004 | Yanagisawa | 257/675 |
| 2004/0089934 A1 * | 5/2004 | Shimoida et al. | 257/686 |
| 2004/0099940 A1 * | 5/2004 | Standing | 257/693 |
| 2005/0032347 A1 * | 2/2005 | Hase et al. | 438/612 |
| 2005/0224945 A1 * | 10/2005 | Saito et al. | 257/686 |
| 2006/0186516 A1 | 8/2006 | Yanagisawa | |
| 2007/0108560 A1 * | 5/2007 | Tang et al. | 257/666 |
| 2007/0262346 A1 * | 11/2007 | Otremba et al. | 257/177 |

FOREIGN PATENT DOCUMENTS

| | | |
|---|---|---|
| DE | 696 19 604 T2 | 8/2002 |
| DE | 695 28 335 T2 | 6/2003 |
| DE | 103 14 172 A1 | 11/2004 |
| DE | 102005027356 | * 12/2006 |
| WO | 03/003247 A2 | 1/2003 |
| WO | 2004/077548 A2 | 9/2004 |
| WO | 1020060133664 | * 12/2006 |

OTHER PUBLICATIONS

English Translation of Abstract and Claims for German Patent DE 103 14 172 A1 (pp. 1-10), May 9, 2007.
Office Action for DE102007009521.1-33 dated Nov. 14, 2007.

* cited by examiner

Primary Examiner — Matthew E Warren
Assistant Examiner — Fang-Xing Jiang
(74) Attorney, Agent, or Firm — Banner & Witcoff, Ltd.

(57) ABSTRACT

A component has a device applied to a device carrier, a first conducting layer grown onto the device and onto the device carrier, and an insulating material applied to the first conducting layer such that only a portion of the first conducting layer is covered.

23 Claims, 6 Drawing Sheets

COMPONENT, POWER COMPONENT, APPARATUS, METHOD OF MANUFACTURING A COMPONENT, AND METHOD OF MANUFACTURING A POWER SEMICONDUCTOR COMPONENT

RELATED APPLICATIONS

This application claims priority from German Patent Application No. 10 2007 009 521.1, which was filed on Feb. 27, 2007, and is incorporated herein by reference in its entirety.

TECHNICAL FIELD

The present invention relates to heat dissipation in components, for example to heat dissipation in power semiconductor components.

BACKGROUND

The increase in the packaging density and/or miniaturization of components results in that heat generation, caused by the current flow and/or possible switching operations, has become more important with regard to the lifetime of the components. In particular, this applies to power semiconductor devices.

Therefore, enhanced heat dissipation is desirable to enable a higher level of loading and/or a longer lifetime of the components.

SUMMARY

According to an embodiment a component may comprise: a device carrier; a device applied to the device carrier; a first conducting layer grown onto the device and onto the device carrier; and an insulating material applied to the first conducting layer such that only a portion of the first conducting layer is covered.

BRIEF DESCRIPTION OF THE DRAWINGS

The embodiments will be detailed subsequently referring to the appended drawings, in which.

DETAILED DESCRIPTION

Figure 1A:
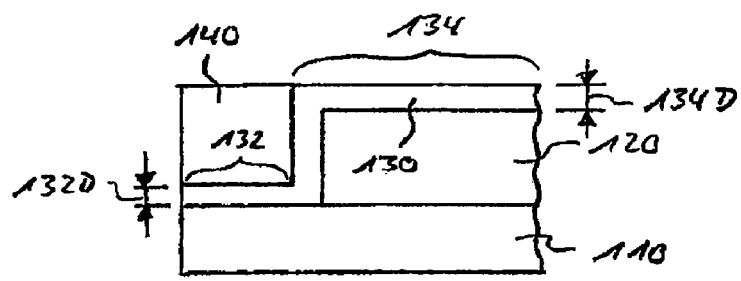
FIG. 1A shows a cross section of a part of an embodiment of a component.

According to another embodiment, a method of manufacturing a component may comprise: providing a device carrier; providing a device; applying the device to the device carrier; growing a first conducting layer onto the device and onto the device carrier; and applying an insulating material to the first conducting layer in such a manner that only a portion of the first conducting layer is covered.

An advantage of the embodiments is that the exposed portion of the first conducting layer enables additional heat dissipation.

In addition, the embodiments have the advantage that they can be electrically and/or thermally coupled to other components via the exposed portion of the first conducting layer in a stack configuration.

In the present application, identical or similar reference numerals will be used for objects and functional units having identical or similar functional properties. In this context, it shall be noted that on the one hand, unless explicitly indicated otherwise, sections which relate to objects having similar or identical functional properties are exchangeable among the descriptions of the various embodiments. On the other hand, it is to be noted that a shared use of a reference numeral for an object occurring in more than one embodiment does not necessarily mean that these comprise identical features and properties in the various embodiments or the embodiments in question. Shared or similar reference numerals thus do not give any indication with regard to the specific layout and dimensioning.

FIG. 1A shows a cross section of a part of a component 100 comprising a device carrier 110, a device 120 applied to the device carrier, and a first conducting layer 130 grown onto the device 120 and onto the device carrier 110. In addition, the component comprises an insulating material 140 which is applied to the first conducting layer 130 such that a portion 132 of the first conducting layer 130 is covered, and another portion 134 of the first conducting layer 130 is exposed. The first conducting layer has been generated and/or grown by means of a planar bonding technique, as will be explained later on in more detail. In the embodiment in accordance with FIG. 1A, the first conducting layer has equal layer thicknesses in the covered portion 132 and in the exposed portion 134. In other words, the layer thickness 132D of the covered portion 132 is essentially, i.e. apart from manufacturing tolerances, identical with the layer thickness 134D of exposed portion 134.

Figure 1B:
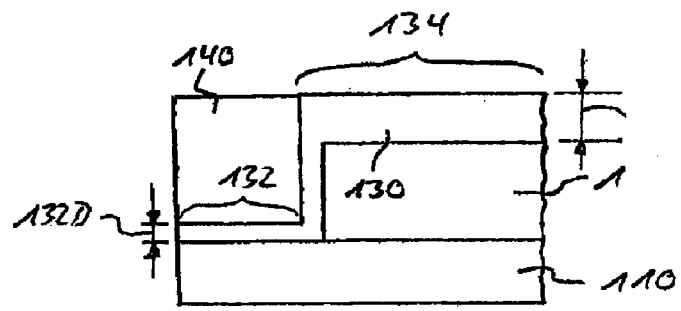
FIG. 1B shows a cross section of a part of an embodiment, wherein the exposed portion of the first conducting layer has a larger layer thickness than that portion of the first conducting layer which is covered by the insulating material.

FIG. 1B shows a cross section of a portion of a further embodiment of a component 100', which is similar to the component shown in FIG. 1A and differs from same in that the layer thickness 134D of the exposed portion 134 is larger than the layer thickness 132D of the covered portion 132 of the first conducting layer 130. In other words, the exposed portion 134 of the first conducting layer comprises a larger layer thickness than portion 132 of first conducting layer 130, which is covered by the insulating material 140.

Exposed portion 134 of the first conducting layer may comprise a single layer, or it may comprise two or more grown partial layers superimposed on one another.

In addition, as is depicted in FIGS. 1A and 1B, insulating material 140 may define a package within which the device carrier 310, the device 120 and the first conductive layer 130 are embedded such that the exposed portion 334 of the first conducting layer 130 is located within package 140.

The device carrier 110 may be an electrically insulating device carrier or a conductive device carrier, as will be explained below in more detail.

Figure 2B:
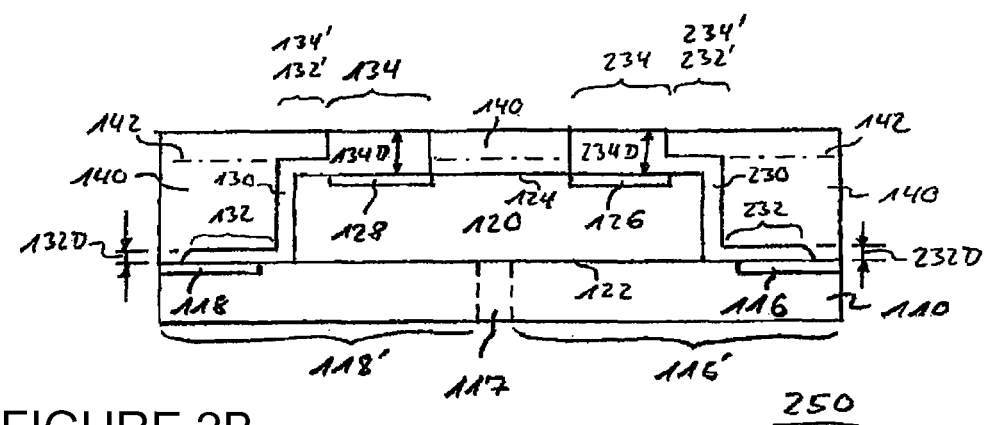
FIG. 2B shows a cross section of an embodiment of a component having two top component contacts.
Figure 2A:
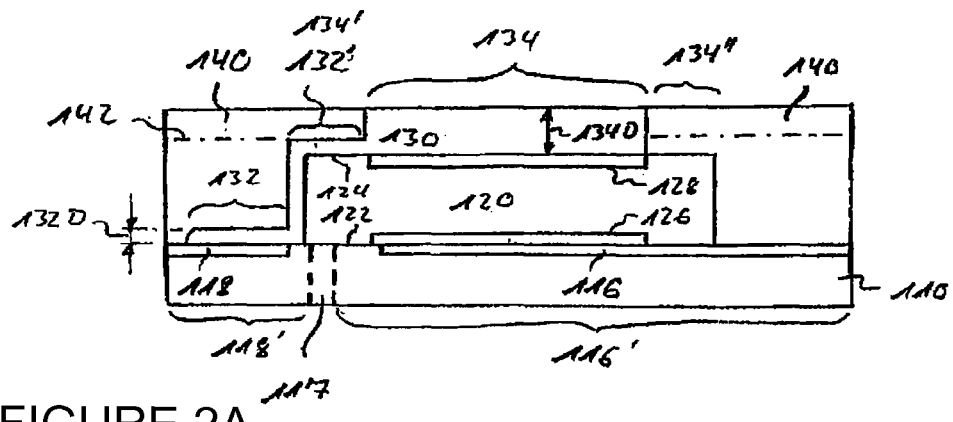
FIG. 2A shows a cross section of an embodiment of a component comprising component contacts arranged on opposite sides.

FIG. 2A shows a cross section of a component 200 comprising a device carrier 110 and a device 120 applied to the device carrier 110, the device 120 comprising a first surface 122 facing the device carrier 110, and a second surface 124 facing away from the device carrier 110, i.e. located opposite the first surface 122.

Device carrier 110 comprises a first device carrier lead 116 and a second device carrier lead 118, which are electrically insulated from one another.

Device 120 comprises a first device contact 126 located on the first surface 122 and electrically connected to the first device carrier lead 116. Device 120 comprises a second device contact 128 located on the second surface 124 and electrically connected to the second device carrier lead 118 by the first conducting layer 130.

The exposed area 134 of the first conducting layer is thicker, in the embodiment in accordance with FIG. 2A, than the covered portion 132 of the first conducting layer, the covered area 132 in this embodiment also comprising a section 132' located over device 120 but being covered by insulating material 140. As is depicted in FIG. 2A, the covered portion 132 of the first conducting layer 130 is electrically connected to the second device carrier lead 118, and the exposed portion 134 of the first conducting layer 130 is electrically connected to the second device contact 128.

In the embodiment in accordance with FIG. 2A, the layer thickness 134D of the exposed portion is larger than the layer thickness 132D of the covered portion of the first conducting layer 130. Alternatively, however, the exposed portion 134 may also have the same layer thickness as the covered portion 132, see the dash-dotted line exhibiting reference numeral 142. In this case, the exposed portion 134 also includes that portion of the conducting layer which is designated by 134' and is arranged over the device, but not over the second device contact 128.

In addition, embodiments of component 200 may vary in that the exposed portion 134 is arranged over the second device contact 128 only, while it fully, see FIG. 2A, or partially covers same, or covers a larger area of the second surface 124 than that defined by the second device contact 128, e.g. the entire area 134' or only portions thereof, and/or, accordingly, on the other, right-hand side 134".

In the above-described cases, insulating material 140, for example, forms a package within which device carrier 110, device 120 and first conductive layer 130 are embedded such that exposed portion 134 of the first conducting layer is located within package 140.

For clarity's sake, only reference numeral 134 will be used instead of reference numerals 134, 134' and 134" in the following, irrespective of whether exposed portion 134 extends over or adjacent to second device contact 128.

Further embodiments of the component are characterized in that device carrier 110 is a conductive device carrier 110, for example a lead frame. In this case, device carrier 110 comprises a first device carrier lead 116', which not only comprises the area designated by reference numeral 116, but also that designated by reference numeral 116', and a second device carrier lead 118' which comprises not only the area designated by 118, but the entire area marked by strokes 118. In this case, the component comprises an insulator, or an insulating area, 117 which may comprise, for example, insulating material 140, but also a different type of insulating material, and which electrically insulates the two device carrier leads.

In order to avoid unnecessary enumerations of reference numerals, reference numeral 116 will be used, instead of the two reference numerals 116, 116', for the first device carrier lead, and reference numeral 118 will be used, instead of reference numerals 118, 118', for the second device carrier lead, irrespective of whether what is dealt with is an insulating or a conductive device carrier 110.

This configuration of the device is also referred to as a transversal device because of the structure.

FIG. 2B shows a cross section of a component 250 comprising a device carrier 110, a device 120 applied to the device carrier, the device 120 comprising a first surface 122 facing the device carrier 110, and a second surface 124 located opposite the first surface 122. Device 120 comprises a first device contact 126 and a second device contact 128, which are both located on the same surface, i.e. on the second surface 124 facing away from device carrier 110.

FIG. 2B shows a further embodiment of a component comprising a device carrier 110 which exhibits a first device carrier contact 116 and a second device contact carrier 118, and a device 120, applied to the device carrier and having a first device contact 126 and a second device contact 128, the first device contact 126 and the second device contact 128 both being arranged, unlike in FIG. 2A, on the second surface 124 of the device. As has already been described in FIG. 2A, in this embodiment the second device contact 128 is also electrically connected to the second device carrier lead 118 via the first conducting layer 130. Unlike the embodiment in FIG. 2A, however, the first device contact 126 is electrically connected to the first device carrier lead 316 via a grown conducting layer which will be referred to below as the second conducting layer 230. Like the first conducting layer 130, the second conducting layer 230 comprises a covered portion 232 and an exposed portion 234, the covered portion 232 also including, in the embodiment in accordance with FIG. 2B, a covered portion 232', and the thickness 234D of the exposed portion 234 being larger than the thickness 232D of the covered portion.

In alternative embodiments, the thickness of the exposed portion 234D may be the same as the thickness 232D of the covered portion, see the dash-dotted line 240, so that the exposed portion 234 also includes the exposed portion 234', as has already been explained in FIG. 2A.

Generally, it may be said that with regard to the various possibilities of implementation, e.g. in terms of which areas of the second surface 124 and/or of the first contact 126 are covered by the exposed portion 234, 234', the same possibilities exist which have already been discussed for the first conducting layer 130 in accordance with FIG. 2A. The arrangement of the second conducting layer 230 may correspond to that of the first conducting layer 130, and/or may have, in terms of its structure, a mirror symmetry, as it were, but it may also have any other shapes.

The same applies with regard to the embodiments comprising an insulating substrate or a conductive substrate, as has already been discussed with regard to FIG. 2A.

Alternative embodiments of the components of FIGS. 2A and 2B may also comprise, similar to the representation in FIGS. 1A and 1B, a device carrier 110 which has no device carrier leads 116 and 118, but wherein the first conducting layer 130 and/or, as the situation may be, the second conducting layer 230 is brought to the edge of the package 140 to enable electrical connection.

Like in FIG. 2A, insulating material 140 forms a package which embeds device carrier 110, device 120 and first conducting layer 130 and second conducting layer 230 such that portion 134 and 234, respectively, of the first and second conducting layers are exposed over device 120.

Figure 3A:
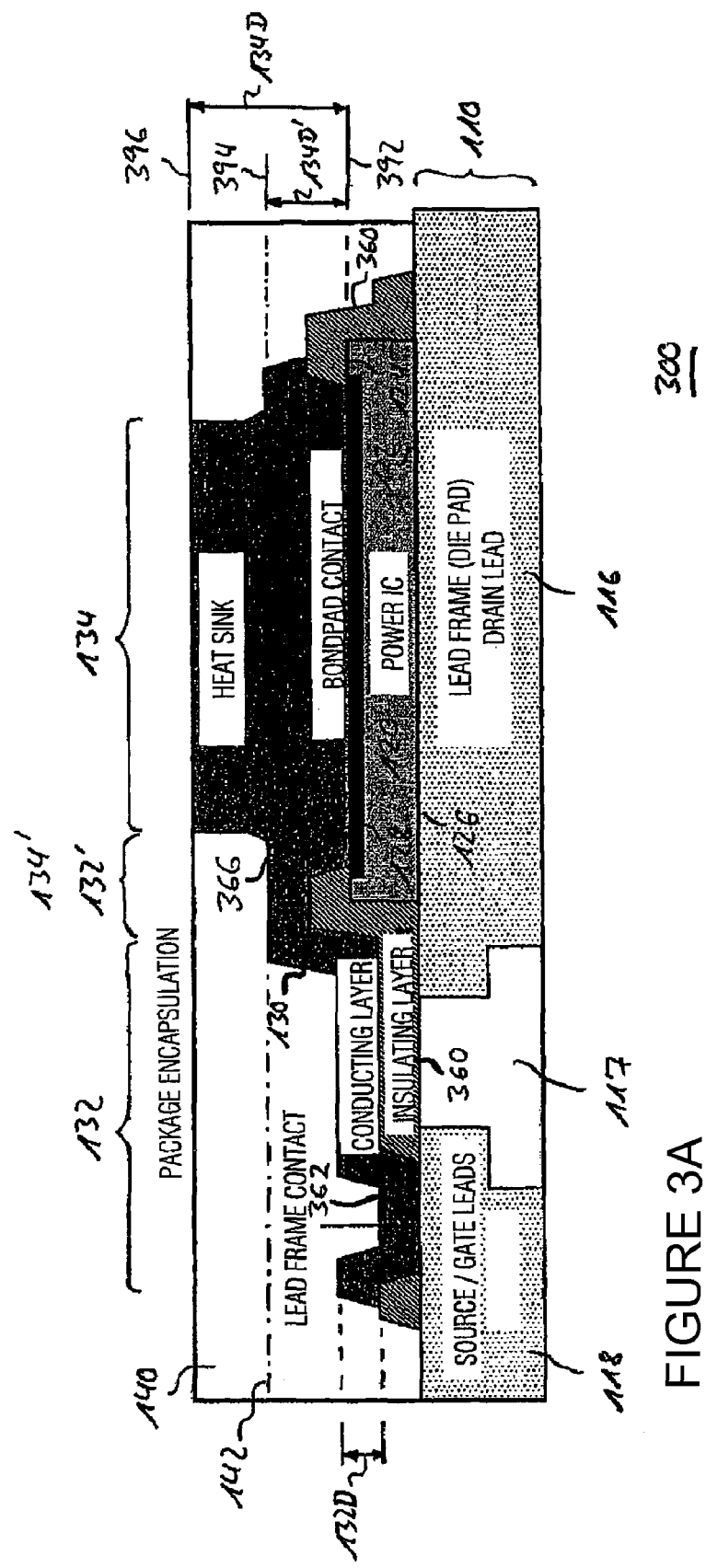
FIG. 3A shows a cross section of an embodiment of a power component on a lead-frame basis.

FIG. 3A shows an embodiment of a basic utilization of the planar bonding technique within a flat package without pins, which is also referred to as a leadless package, in cross section. A semiconductor unit 120 has been attached on the die pad 116, e.g. by means of soldering or gluing using an electrically conducting glue, the bottom of die pad 116 representing, for example, the outer drain lead of the package, in the case of a power semiconductor 120. The expression die pad 116 signifies that the device has been applied to this lead area. A structured insulating layer 360 supports conducing layer 130, which interconnects the contact openings on lead frame 118 and the contact opening on chip 120. Conducting layer 130 may be a grown conducting layer which has been grown, for example by deposition, onto the structured insulating layer 360 and into the openings. For sealing the bottom of package 140 in an optimum manner, the space located underneath the foil or insulating layer 360 and/or within trench 117 and/or within gap 117 between die pad 116 and the gate source leads must be completely filled up with a molding compound. This requirement is easiest to meet in the event of an approximately planar insulating layer bridge 360 in remolding plastics. Beside FIG. 3A, the conducting layer, for example a copper conducting 130, is configured, immediately over chip 120, such that after encapsulation, this copper layer, or this portion of the copper layer 134, is exposed, i.e. non-encapsulated, on the top of the package. Due to the thermal conductivity of the copper, a much better heat dissipation of component 120 may be effected during operation than by means of the plastics molding compound 140. In addition, a further package may be bonded to this exposed copper layer 134 by means of solder material or glue.

Figure 3B:
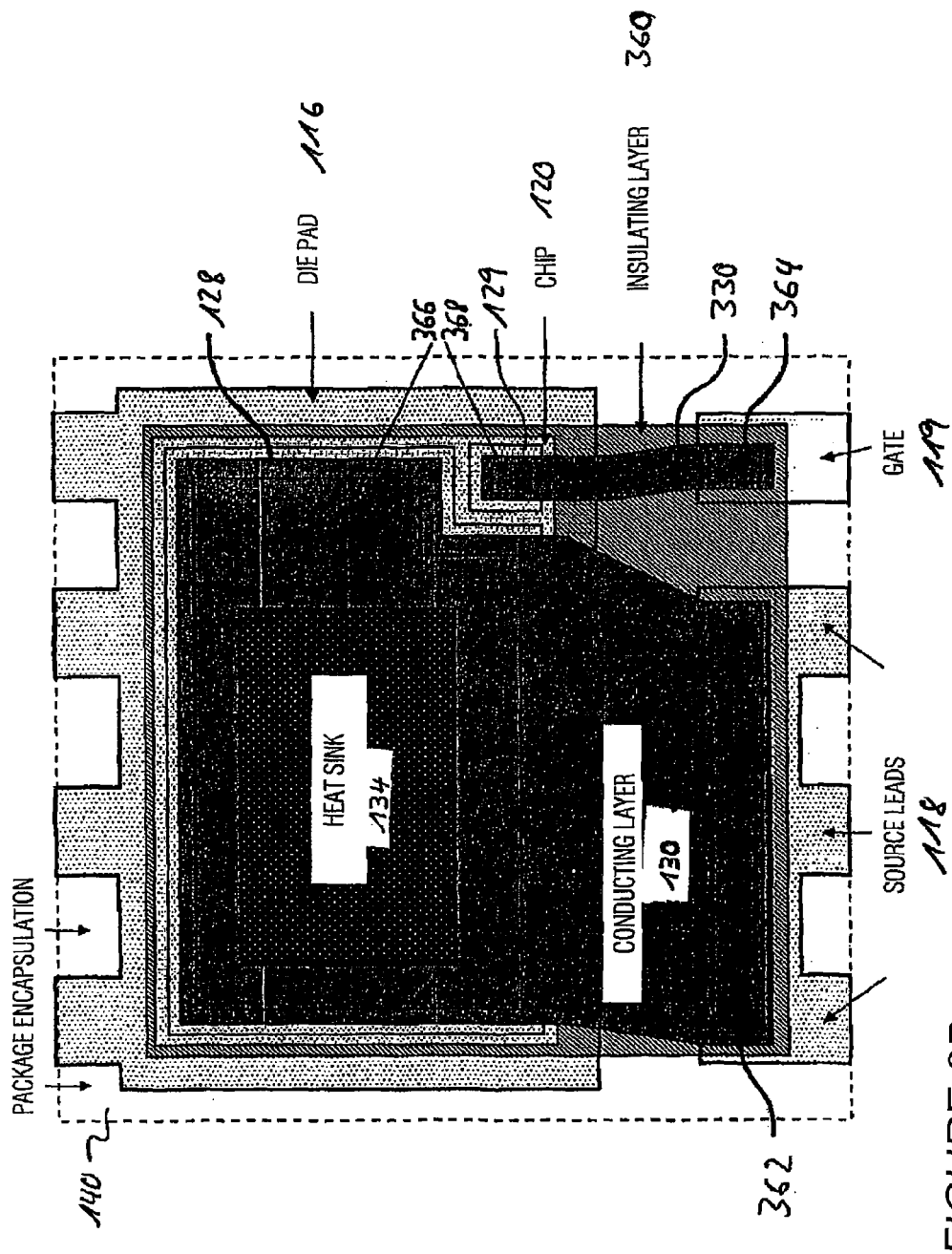
FIG. 3B shows a top view of an embodiment in accordance with FIG. 3A.

FIG. 3B shows a top view of the example of use of FIG. 3A. The source connection 130 contacts the chip 120 across a large area, and may be deposited in a thickness of 100 μm or more so as to act as an efficient current and heat conductor. The gate connection 330 may be produced in a clearly smaller thickness so as to be able to generate smaller lateral structures. The area 134, designated by "heat sink", over chip 120 comprises the largest layer thickness and is exposed on the top of the package, see reference numeral 134.

Power component 300 comprises a lead frame 110, or conductive device carrier 110, a semiconductor power device 120, an insulating layer 360, a first conducting layer 130 as well as insulating material 140. The lead frame 110 comprises at least one first lead 116, at least one second lead 118, and at least one third lead 119 which are insulated from one another, as is depicted, for example, by the insulating area 117 in FIG. 3A. The semiconductor power device 120 comprises a first contact 126 on a first surface 122 of the semiconductor power device, a second contact 128 on a second surface 124 of the semiconductor power device 120 which is opposite the first surface, as well as a control contact 129 also located on the second surface 124 of the semiconductor power device 120. Insulating layer 360 at least partially covers lead frame 110 and semiconductor power device 120, insulating layer 360 comprising a first opening 362, a second opening 364, a third opening 366, and a fourth opening 368 at least within the area of the second 128 and third 129 leads of lead frame 110, and in the area of second contact 128, and of control contact 129 of semiconductor power device 120. First opening 362 exposes second lead 118 of lead frame 110, second opening 364 exposes third lead 119 of the lead frame, third opening 366 exposes second contact 128, and fourth opening 368 exposes control contact 124 of the semiconductor power device. First conducting layer 130 is applied to insulating layer 360, and extends into first opening 362 and third opening 366 within the insulating layer, and connects second lead 118 of the lead frame to second contact 128 of the semiconductor power device. Second conducting layer 330 is applied to insulating layer 360, and extends into second opening 364 and fourth opening 368 within insulating layer 360, and connects third lead 119 of the lead frame to control contact 129 of the semiconductor power device. Lead frame 110, semiconductor power device 120, first conducting layer 130, and second conducting layer 330 are at least partially embedded within the package, and/or by the insulating material 140, such that a portion 134 of first conducting layer 130 remains exposed over semiconductor power device 120.

In the embodiment depicted in FIGS. 3A and 3B, the semiconductor power device is a power IC (IC=integrated circuit), wherein first contact 126 is a drain contact, second contact 128 is a source contact, and control contact 120 is a gate contact. Accordingly, first lead 116 of the lead frame is a drain lead, also referred to as a die pad, second lead 118 is a source lead, and third, or control, lead 119 is a gate lead.

In dashed lines, FIG. 3B depicts the package encapsulation by the insulating material 140. The insulating material stabilizes the entire component 300 in that it typically not only covers lead frame 110, first and second conductive layers 130 and 330, as well as exposed portions of insulating layer 360 from above, but is also used to fill, depending on the manufacturing process, the insulating gap 117 between the first, second, and third lead areas 116, 118, 119, respectively.

Instead of a power IC, alternative embodiments of components comprise, for example, power diodes or any other type of device or semiconductor chip having two, three or more different contacts which are insulated from one another, e.g. semiconductor sensors, semiconductor lasers or logic ICs, the structure being adapted accordingly.

An embodiment having a power diode as the device 120 may be structured in a similar manner to that of FIG. 3A, in this case, for example, first contact 126 being the cathode, and first lead area 116 being the cathode lead, and second contact 128 being the anode contact, and second lead area 118 being the anode lead.

With reference to FIG. 3A, an explanation will be given below, by way of example and in the style of FIGS. 1A to 2B, as to how the exposed portion 134 may be configured in various embodiments.

In the embodiment of FIG. 3A, one may differentiate, for example, between three height levels, a first height level 392, a second height level 394, and a third height level 396, the third height level 396 describing the height level of the second device contact 128 shown in FIG. 3A, the second height level 394 describing the height level resulting from the insulating layer 360 partially covering also device 120, at the edge thereof, and thus bridging the first conducting layer 130 so as to electrically connect second device contact 128 to second device carrier lead 118, and first height level 392 being defined by second device contact 128.

Raising the exposed portion 134 of first conducting layer 130 up to third height level 396 may be effected by an additional process step, e.g. by generating an additional conducting layer, or conductive partial layer. In an alternative embodiment, first conducting layer 130 only reaches up to second height level 394, so that the exposed portion 134' results, and conducting layer 130 and insulating material 140 only reach up to second level 394. In both cases, the layer thickness of exposed portion 134D or 134D' is larger, at least in specific areas, e.g. 134, than the layer thickness 132D of covered portion 132 or 132'.

An advantage of the embodiment, wherein both the conductive layer within exposed portion 134, and insulating material 140 reach up to second height level 394, is that the process step of reinforcing the first conducting layer up to third height level 396 within area 134 is dispensed with. An advantage of a component reaching up to third height level 396, and as is shown in FIG. 3A by the continuous lines, is that the insulation of the other areas of the component is better, since insulating layer 140 has a larger thickness. An advantage of the embodiment comprising the raised, or exposed, portion 134 is that a sufficient thickness of the layer of the insulating material 140 may be ensured over the covered portion 132 of first conducting layer 130. Specifically with components comprising several conducting layers which are electrically insulated from one another, a sufficient thickness of the layer of insulating material 140 may thus be ensured over the covered portions of these conducting layers, so that the probability of a breakdown at high field strengths, or voltages, may be reduced.

Insulating layer 360 may be manufactured in various ways. For example, as a layer which is deposited and structured by means of planar technology, or, for example, as a foil applied to the device and/or to the chip and the lead frame, and is subsequently structured, for example, by means of a laser. The insulating layer consists of an electrically insulating material and comprises plastic, for example. The thickness of the insulating layer may range from 5 μm to 500 μm, it being possible for the insulating layer to comprise several superimposed partial layers.

Any substrates on an organic or inorganic basis, for example made of ceramics, may be employed as electrically insulating device carriers. For example, so-called lead frames may be employed as electrically conducting device carriers. The lead frames, or lead areas, may comprise copper, silver, or gold.

The partial layers of first conducting layer 130 may comprise different materials or material compositions.

Figure 4:
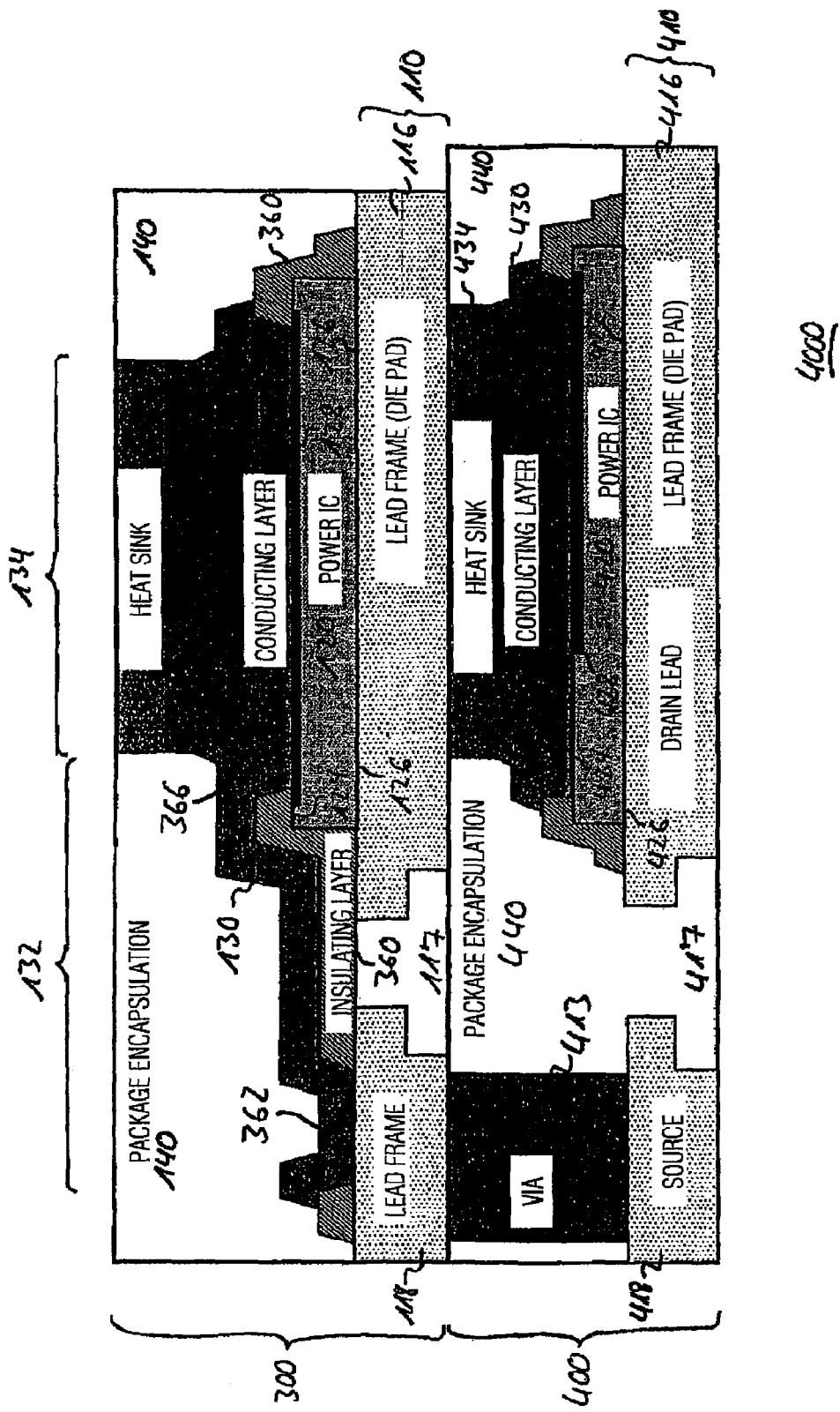
FIG. 4 shows a cross section of a stack configuration of two power components.

FIG. 4 shows a stack configuration of two components 300 and 400. First component 300 corresponds to the component described with reference to FIGS. 3A and 3B. Second component 400 comprises a conductive device carrier 410, a device 420, and a first conducting layer 430 as well as a package 440. Device carrier 410 of the second component comprises a first device carrier lead 416 and a second device carrier lead 418 which are insulated from each other, as is depicted by reference numeral 417 in FIG. 4, it being possible, as has already been described in the previous embodiments, to realize insulation 417 for example by means of insulating material 440 for the package encapsulation which fills up the gap between first device carrier lead 416 and second device carrier lead 418. Device 420 of second component 400 comprises a first device contact 426 and a second device contact 428, first device contact 426 being located on a first surface 422 of device 420, which faces the conductive device carrier 410 of the second component, and being electrically connected to first device carrier lead 416 of device carrier 410 of second component 400, and second device contact 428 being located on a second surface 424 positioned opposite first surface 422. Package 440 at least partially embeds conductive device carrier 410 of second component 400, first conducting layer 430 of the second component, and device 420 of the second component. As is shown in FIG. 4, first component 300 is located over second component 400. First conducting layer 430 of second component 400 is embedded into package 440 of the second component such that a portion 434 of first conducting layer 430 of second component 400 is exposed over device 420 of the second component, and first device carrier lead 116 of first component 300 is located essentially over, and is electrically connected to, second device contact 420 of second component 420. In addition, FIG. 4 depicts an embodiment wherein second device carrier lead 418 of second component 400 is electrically connected to second device carrier lead 118 of first component 300 by a via 413 through package 440 of second component 400.

In one embodiment, first device 120 of first component 300, and device 420 of second component 400 are, for example, a power semiconductor device (power IC). In this case, first device carrier lead area 116 corresponds, for example, to the drain lead, also referred to as die pad, and second device carrier lead 118 corresponds to the source lead of device carrier 110 of first component 300. First device contact 126 corresponds to the drain contact, and second device contact 128 of device 120 of first component 300 corresponds to the source contact. First device carrier lead 416 corresponds to the drain lead, and second device carrier lead 418 of device carrier 410 of second component 400 corresponds to the source lead. In the embodiment of FIG. 4, source contact 128 of the device of first component 300 is electrically connected to source lead 118 of first component 300 via first conducting layer 130 and opening 362 within insulating layer 360 of first component 300, and is electrically connected to source lead 418 of second component 400 by via 413. Thus, the stack configuration, which consists of the two components 300 and 400, comprises a shared source lead 418 and a shared drain lead 416. The same approach can be adopted for the electrical connection of, for example, the gate leads, which are not depicted in FIG. 4.

In other words, FIG. 4 depicts a package-on-package assembly using embodiments. In the configuration, depicted in FIG. 4, of a package stack 4000, two power semiconductors 120, 420 are arranged in a half-bridge configuration, the drain lead 126 of the high-side transistor 120 (upper package) being connected to the source lead of the low-side transistor 400 (lower package). Source lead 118 of the upper package 300 is provided to the conducting layer within the lower package 400 by a VIA connection 413. Similarly, further lead contacts for the upper package 300 may be generated, such as the gate lead. The gate lead of the lower package 400 is not depicted in FIG. 4 and may be realized as has been depicted and/or explained with reference to FIGS. 3A and 3B, for example.

Upper package 300 may be assembled onto the lower package by means of reflow soldering or by applying a conductive adhesive at the exposed contact areas.

As may be seen from FIG. 4, embodiments of the components enable stack configurations having several advantages. By the exposed portion 434, a connection, which is large in area and efficient to realize, of components stacked one upon the other is enabled which has a very low electric and/or thermal resistance. It is not only possible to stack two components, as is depicted in FIG. 4, but also more than two components one above the other, and/or to electrically and/or thermally connect more than two components, as the case may be. In addition, configurations as have been depicted by way of example in FIG. 4 have the advantage that both the upper component 300 and the lower component 400 comprise two heat sinks, or two possibilities of heat dissipation. In the upper component 300, the heat is carried off upward through the exposed portion 134 as the heat sink, and is dissipated via first device carrier lead 116 as the second heat sink. In the lower component 400, the heat is carried off via the exposed portion 434 of the first conducting layer and the first device carrier lead 116 of the upper component 300, and is carried off via the first device carrier lead 416 of lower component 400.

Figure 5:
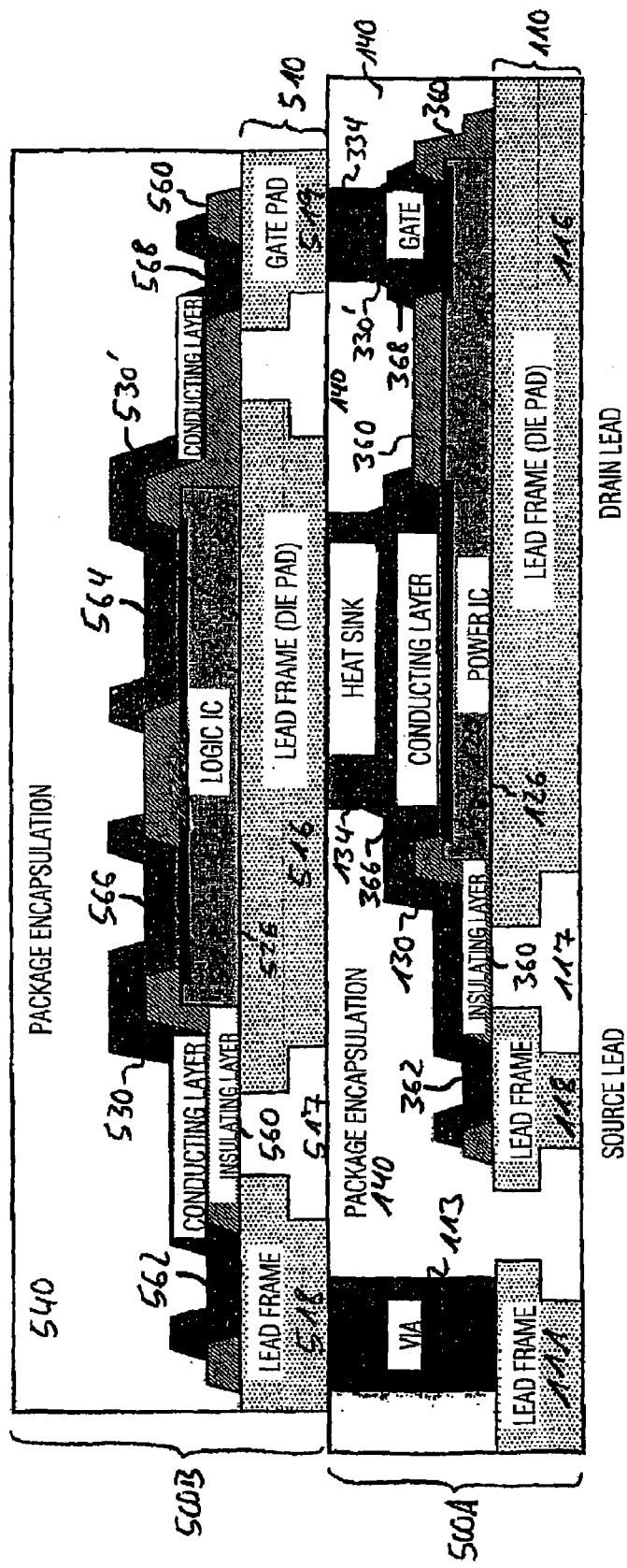
FIG. 5 shows a cross section of a stack configuration of a logic component and a power component.

FIG. 5 shows an alternative stack configuration consisting of two components 500A and 500B.

The lower, or first, component 500A comprises a device carrier 110, a device 120, an insulating layer 360, a first conducting layer 130, a second conducting layer 330', a via 113, as well as a package encapsulation 140. Device carrier 110 of first component 500A comprises a first device carrier lead 116, a second device carrier lead 118, and a third device carrier lead 111 which are insulated from one another, as is depicted, for example, by reference numeral 117 between the first and second device carrier leads 116 and 118.

Device 120 of first component 500A comprises a first device contact 126, a second device contact 128, and a third device contact 129, first device 126 being arranged on a first surface 122 of device 120, which is facing device carrier 110, and second device contact 128 and third device contact 129 being arranged on a second surface 124 located opposite first surface 122. First device contact 126 is electrically connected to first device carrier lead 116. Second device contact 128 is connected to conducting layer 130 via an opening 366 within insulating layer 360, and is electrically connected to second device carrier lead 118 via conducting layer 130 and a further opening 362 within the insulating layer. First conducting layer 130 is reinforced over a partial area of second device contact 128, so that a portion 134 of first conducting layer 130 is exposed, i.e. is not encapsulated by insulating mass 140. Second conducting layer 330', which is electrically connected to third device contact 129 via an opening 368 within insulating layer 360, is reinforced over the third device contact 129 such that an area, or a portion, 334 of second conducting layer 330 is exposed, or is not encapsulated by insulating material 140.

The upper, or second, component 500B comprises a device carrier 510, a device 520, an insulating layer 560, a first conducting layer 530, a second conducting layer 530', as well as insulating material and/or a package encapsulation 540. Device carrier 510 comprises a first device carrier lead 516, a second device carrier lead 518, and a third device carrier lead 519, which are insulated from one another, as is depicted by means of reference numerals 517 and 517'. Device 520 of second component 500B comprises a first device contact 526, a second device contact 528, and a third device contact 529, the first device 526 being located on a first surface 522 of device 520, which faces component carrier 510, and second device contact 528 and third device contact 529 being located on a second surface 524 of device 520, which is facing away from, or located opposite, first surface 522. Insulating layer 560 bridges the insulating areas 517 and 517'. First device contact 526 is electrically connected to first device carrier lead 516. Second device contact 528 is electrically connected, via an opening 566 within insulating layer 560, to first conducting layer 530 which electrically connects same to second device carrier lead 518 via a further opening 562 within insulating layer 560. Third device contact 529 is electrically connected to second conducting layer 530' via an opening 564 within insulating layer 560, and is electrically connected to third device carrier lead 519 via said opening and via a further opening 568 within insulating layer 560.

The upper component 500B is arranged, over lower component 500A, such that first device carrier lead 516 and third device carrier lead 519 are arranged over the exposed portions 134 and 334 of first conducting layer 130 and second conducting layer 330, respectively, of lower component 500A. In addition, second device carrier lead 518 of upper component 500B is electrically connected to third device carrier lead 111 of lower component 500A.

In one embodiment, the lower component comprises resources a power semiconductor device (power IC) 120, and upper component 500B comprises, for example, a logic semiconductor device (logic IC). In this case, for example within lower component 500A, first device carrier lead 116 corresponds to a drain lead, also referred to as die pad, second device carrier lead 118 corresponds to a source lead, and third device carrier lead 111 corresponds to a logic lead, for example. First device contact 126 corresponds to a drain contact, second device contact 128 corresponds to a source contact, and third device contact 129 corresponds to a gate contact. In this case, first device carrier lead 516 further corresponds to a die pad lead, second device carrier lead 518 corresponds to a logic lead, and third device carrier lead 519 corresponds to a gate lead.

In addition, second device contact 528 corresponds to a logic contact, and third device contact 529 of device 520 of upper component 500B corresponds to a gate contact. In this case, gate contact 129 of device 120 of the lower component is electrically connected, via second conducting layer 330', to gate lead 519 of upper component 500B, and to gate contact 529 of device 520 of upper component 500B. In addition, logic contact 528 of device 520 of upper component 500B is electrically connected to logic lead 111 of lower component 500A via first conducting layer 530, second device carrier lead 518 of upper component 500B, via 113.

In other words, FIG. 5 shows a further embodiment of a package stack, wherein the upper package has a logic unit bonded, by via connections 113, to the outer contact areas 111 of lower package 500A which, in turn, enable contact with the circuit board. The logic unit 520 may be connected, via the gate connection 330' shown, to the power semiconductor 120 within lower package 500A for controlling purposes. The die pad 516 of upper package 500B may be connected to lower package 500A in a conducting manner (i.e. by means of a solder and/or an electrically and/or thermally conductive adhesive) or in a non-conducting manner (for example by means of an electrically insulating, but thermally conducting adhesive).

Stack configurations with components as have been explained by way of example with reference to FIG. 5 using components 500A and 500B have the advantage that, e.g., lower component 500A comprises two heat sinks, or two possibilities of heat dissipation. On the one hand, the heat may be carried off via first device carrier lead 116 of lower component 500A, and on the other hand, via the exposed portion 134 of first conducting layer 130 of first component 500A, the connection of the two packages 500A and 500B in this case being at least thermally conducting, irrespectively of the electrical conductivity of the connection. In further embodiments, first conductive layer 530 and second conductive layer 530' of upper component 500B are reinforced, for example also with logic ICs, over second and/or third contacts 528 and 529, respectively, in such a manner that at least one of the two conducting layers comprises an exposed portion which is not encapsulated by insulating material 540, but is exposed.

Insulating layer 360, 460 and/or 560 of FIGS. 4 and 5 may have been manufactured by means of planar technology or by means of insulating foils which have been or are structured accordingly so as to implement the openings, or vias, between the device carrier leads, the device contacts, and the respective conducting layers.

When manufacturing components using discrete devices, such as sensors, diodes, transistors or, generally, chips, different techniques may be employed to electrically connect the discrete devices, for example with conductive traces applied to a device carrier, or with other devices. A common bonding technique is wire contacting. A further possibility is contacting by means of copper clips, the so-called clipping method.

In wire contacting, the connections are established by so-called bond wires made of gold or aluminum, the direct contact between the bonding wires and the leads areas being created by alloying the metals involved while supplying energy. The relatively small cross-sectional area of the wire connection determines the thermal electric resistance. A potential weak spot for bond breaks are those areas at the contact area which have been fused on and later on recrystalized. Aging processes of the alloy connections due to diffusion processes may cause a creeping increase in the contact resistance, and thus may cause a problem with regard to reliability.

With the clip method, a metal clip which due to its relatively large cross-sectional area enables large-area contacting, and thus leads to a reduction in the electric resistance, is used instead of the bonding wires. At the same time, heat dissipation from the front of the chip is improved by a reduced thermal resistance and an increased heat buffering capacity of the connection. However, with regard to the arrangement of the bonding pads, flexibility is low, which is why a new clip construction becomes necessary every time that there are changes. In addition, the possibilities of disentanglement in the event of complex wiring, i.e. in multi-chip packages, are limited.

The embodiments employ a planar bonding technique so as to connect devices, for example, with the device carriers. Advantages of embodiments using a planar bonding technique comprise the following, for example:

- low electrical and thermal resistance due to the large connection cross section in comparison with bonding wires;
- fast and low-loss switching due to low stray inductance of the flat connections;
- the small structural height of the connections enables a flat package architecture;
- production of power and logic connections with different trace cross sections is possible due to multiple combinations of lithographic structuring and electrodeposition;
- high flexibility of the structuring process toward product-dependent bond pad geometry; and/or
- a stack architecture with an alternating sequence of insulating and conducting layers offers, across multi-layer wiring planes, manifold possibilities of disentanglement within the package.

Generally, power semiconductor packages are heated essentially via the contact areas on the back of the package (exposed pad), which face the device carrier, and are heated only to a small extent via the front of the package which faces away from the device carrier and is typically fully covered with molding compound.

In addition, assembly within the package stack is desirable for reasons of saving space on the circuit board. The problem here consists in contacting the back of the upper package, which must be effected via connections within the lower package due to the lack of any direct contact to the circuit board.

Advantages of the embodiments and/or of their structural technology with regard to improved de-heating and to package stacks comprise the following, for example:

Due to a sufficient reinforcement of the metallic conductor trace over the chip, same will be exposed after encapsulation, i.e. will not be enclosed by the encapsulation compound, and may thus enable a very effective de-heating of the chip on the top of the package. Any residues of the molding compound on this area may be removed during the deflashing process following the encapsulation, in particular by utilizing lasers, without leaving any residues.

The exposed conductor trace on the top of the package enables the interconnection of several packages thus produced.

In embodiments of a method of manufacturing a component and/or power component, utilization of a planar bonding technique within a plastic housing is configured such that effective de-heating may be performed across a conducting layer partially exposed on the top of the package. In further embodiments, a further package may be assembled, in a conducting manner, with the bottom side onto the top of the package, e.g. by means of soldering or gluing.

In further embodiments of a method of manufacturing a component, an insulating layer and a conducting layer are applied, for example successively, to the lead frame populated with one or several chips, and are structured in a manner which results in flat connections between the lead areas (planar bonding technique).

An embodiment of an exemplary process flow during package assembly may be configured as follows:

attaching a chip 120 to the lead frame 110 by gluing, soldering or alloying;

applying an insulating layer 130 (depending on the insulating material used, e.g. lithographically or by means of laser ablation);

applying a seed layer by means of a deposition process; the seed layer may consist of partial layers which act as diffusion barriers within the contact holes or improve adhesion;

lithographic structuring on the seed layer galvanic reinforcement of the seed layer after structuring removing the lithography layer (resin or foil)

repeated application of the combination of lithographic structuring and electrodeposition over the chip and in other locations so as to generate the desired larger layer thickness 134D, whereby the exposition of the metal layer 134 for increased heat dissipation and for connecting further packages within this area after encapsulation is made possible;

removing the seed layer between the planar connections by means of differential etching;

package encapsulation by enclosing the circuit carrier with molding compound 140 in an injection molding process;

deflash cleaning and tinning of the package leads; and labeling and separating the packages.

It may therefore be said, with reference to the previous explanations on the embodiments, that the embodiments have the following advantages, for example:

contacting of power semiconductor units having a high level of current-carrying ability and a high level of de-heating within a plastic package; to this end, a connection having as high an electrical and thermal conductivity as possible will be generated from the "bond pads" and/or device contacts on the front of the chip to the lead contacts of the metallic circuit carrier (so-called lead frame);

increased heat dissipation with power semiconductor devices by means of a connection to two heat sinks on the front and back sides of the package; and/or electrical connection several power semiconductor packages in the form of a stack (package-on-package assembly).

Growing, or applying, the conducting layer so as to electrically connect, for example, the leads of the device carriers and the contacts of the devices, may be performed, as has been illustrated above, by physically or chemically depositing electrically conducting material which forms the conducting layer or, as has been described in the preceding exemplary process flow, by electrodeposition. Possible physical methods are sputtering and/or physical vapor deposition (PVD). Possible chemical methods are, for example, liquid phase chemical vapor deposition or chemical vapor deposition—CVD. With electrodeposition, for example, a thin seed layer is initially created which will then have a thicker layer of an electrically conductive material, e.g. copper, deposited thereon.

The growing of the first conducting layer, or of partial layers of a first conducting layer to be generated, may be repeated for so many times until the first conductive layer 130 has the desired layer thickness and/or a specific height level.

Depending on the circumstances, the method embodiments may be implemented in hardware or in software. Implementation may occur on a digital storage medium, in particular a disc or CD or DVD with electronically readable control signals which interact with a programmable computer system such that one of the method embodiments is performed. Generally, the embodiments, thus, also consist in software program products or computer program products or program products with a program code, stored on a machine-readable carrier, for performing one of the method embodiments, when one of the software program products runs on a computer or on a processor. In other words, an embodiment may, thus, be realized as a computer program or a software program or a program having a program code for performing an embodiment, when the program runs on a processor.

In this context, the processor may be formed by a computer, a chip chard, a digital signal processor or any other integrated circuit.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus comprising a first component and a second component stacked onto the first component,
the first component comprising:
a first device carrier comprising a first device carrier lead and a second device carrier lead, the first and second device carrier leads of the first device carrier being electrically insulated from one another;
a first device applied to the first device carrier, the first device comprising a first device contact and a second device contact, the first and second device contacts being electrically insulated from one another;
an insulating layer arranged at least partially on the first device carrier and the first device;
a first conducting layer grown onto the first device, the first device carrier, and the insulating layer, wherein the first conducting layer electrically connects the second device contact with the second device carrier lead of the first device carrier;
a heat sink formed by a portion of the first conducting layer overlying the second device contact, the heat sink portion having a larger layer thickness than a remainder of the first conducting layer and being electrically continuous with the remainder of the first conducting layer; and
an insulating material applied to the first conducting layer, the insulating material defining a first package within which the first device carrier, the first device, and the first conductive layer are embedded such that the heat sink is exposed to a surface of the first package,
wherein the first device is a semiconductor device, and wherein the first device contact is a drain contact and the second device contact is a source contact;
the second component comprising:
a conductive second device carrier comprising a first device carrier lead of the conductive second device carrier and a second device carrier lead of the conductive second device carrier insulated from one another; and
a second device mounted to the conductive second device carrier;
wherein the second component is mounted to the surface of the first package with one of the device carrier leads of the conductive second device carrier coupled to the heat sink of the first component, and
wherein the second device carrier lead of the conductive second device carrier is electrically connected to the second device carrier lead of the first device carrier by a first via through the insulating material of the first package.

2. The apparatus as claimed in claim 1, wherein the insulating material and the heat sink have the same height level.

3. The apparatus as claimed in claim 1, wherein the heat sink portion of the first conducting layer has a larger layer thickness than the portion of the first conducting layer which is covered by the insulating material.

4. The apparatus as claimed in claim 1, wherein the heat sink portion of the first conducting layer comprises at least two partial layers which are grown superimposed on one another.

5. The apparatus as claimed in claim 1, wherein the first device carrier is a conductive device carrier.

6. The apparatus as claimed in claim 1, wherein the heat sink portion of the first conducting layer essentially fully covers the second device contact of the first device.

7. The apparatus as claimed in claim 1, wherein the first device contact of the first device is located on a first surface of the first device which faces the first device carrier, and is electrically connected to the first device carrier lead of the first device carrier, and wherein the second device contact of the first device is located on a second surface of the first device which is opposite the first surface.

8. The apparatus as claimed in claim 1, wherein the insulating layer comprises a second via and a third via, the second via connecting the second device contact of the first device and the first conducting layer, and the third via connecting the second device carrier lead of the first device and the first conducting layer.

9. The apparatus as claimed in claim 1, wherein the first device carrier comprises a third device carrier lead insulated from the first and the second device carrier leads of the first device carrier; and
the first device comprises a third device contact electrically connected to the third device carrier lead of the first device carrier via a second conducting layer.

10. The apparatus as claimed in claim 9, wherein the second conducting layer is at least partially located on the insulating layer.

11. The apparatus as claimed in claim 10, wherein the insulating layer comprises a second via and a third via, the second via connecting the third device contact and the second conducting layer, and the third via connecting the third device carrier lead and the second conducting layer.

12. The apparatus as claimed in claim 9, wherein the third device contact is a gate contact.

13. The apparatus of claim 1,
wherein the second device comprises a first device contact of the second device and a second device contact of the second device, the first device contact of the second device being located on a first surface of the second device which is facing the conductive second device carrier, and being electrically connected to the first device carrier lead of the second device carrier, and the second device contact of the second device being located on a second surface of the second device that is opposite the first surface of the second device; and
wherein the second component further comprises:
 a second conducting layer; and
 a second package, in which the conductive second device carrier, the second conducting layer, and the second device are at least partially embedded in an insulating material of the second package.

14. The apparatus as claimed in claim 13, wherein the second device is a semiconductor device, wherein the second conducting layer is embedded within the second package such that a portion of the second conducting layer is exposed over the second device, the second device carrier lead of the second device carrier being located essentially over the first device contact of the first device carrier, and being electrically connected thereto.

15. The apparatus as claimed in claim 14, wherein the first device carrier and the conductive second device carrier each comprises a third device carrier lead, each of the third device carrier leads being electrically connected to one another by a second via through the first package.

16. The apparatus as claimed in claim 15, wherein the second device is a logic semiconductor device, and the first device is a power semiconductor device, the first device carrier lead of the conductive second device carrier being located over the second device contact of the first device.

17. The apparatus as claimed in claim 16, wherein the second conducting layer electrically connects the second device contact of the second device to the second device carrier lead of the second device.

18. The apparatus as claimed in claim 16, wherein the first device carrier lead of the first device carrier is electrically connected to one of the device contacts of the second device.

19. The apparatus as claimed in claim 16, wherein the third device carrier lead of the conductive second device carrier is insulated from first and second device carrier leads of the conductive second device carrier.

20. The apparatus as claimed in claim 19, wherein the third device carrier lead of the first device carrier is insulated from the first and second device carrier leads of the first device carrier, and wherein the second device comprises a third device contact.

21. The apparatus of claim 1, wherein the insulating layer is disposed on both a top surface and an entire side surface of the first device.

22. The apparatus of claim 1, wherein the insulating layer is created by depositing and structuring the insulating layer using planar technology at least partially onto the first device carrier and the first device.

23. An apparatus comprising a first component and a second component stacked onto the first component,
the first component comprising:
 a first device carrier comprising a first device carrier lead and a second device carrier lead, the first and second device carrier leads of the first device carrier being electrically insulated from one another;
 a first device disposed on the first device carrier, the first device comprising a first device contact and a second device contact, the first and second device contacts being electrically insulated from one another;
 an insulating layer arranged at least partially on the first device carrier and the first device;
 a first conducting layer disposed on the first device, the first device carrier, and the insulating layer, wherein the first conducting layer is configured to electrically connect the second device contact with the second device carrier lead;
 a heat sink formed by a portion of the first conducting layer overlying the second device contact, the heat sink having a larger layer thickness than any other portion of the first conducting layer and being electrically continuous with a remainder of the first conducting layer that is not overlying the second device contact; and
 an insulating material disposed on the first conducting layer, wherein the first device carrier, the first device, and the first conductive layer are embedded in the insulating material such that the heat sink is exposed by the insulating material,
wherein the first device is a semiconductor device, and wherein the first device contact is a drain contact and the second device contact is a source contact;
the second component comprising:
 a conductive second device carrier comprising a first device carrier lead of the conductive second device carrier and a second device carrier lead of the conductive second device carrier insulated from one another; and
 a second device disposed on the conductive second device carrier,
wherein the second component is coupled to a surface of the insulating material, and wherein one of the device carrier leads of the conductive second device carrier is coupled to the heat sink of the first component,
wherein the second device carrier lead of the conductive second device carrier is electrically connected to the second device carrier lead of the first device carrier by a first via through the insulating material.

* * * * *